United States Patent
Van Eijk et al.

(10) Patent No.: US 9,019,470 B2
(45) Date of Patent: Apr. 28, 2015

(54) LITHOGRAPHIC APPARATUS, AND PATTERNING DEVICE FOR USE IN A LITHOGRAPHIC PROCESS

(75) Inventors: Jan Van Eijk, Eindhoven (NL); Engelbertus Antonius Fransiscus Van Der Pasch, Oirschot (NL); Johannes Petrus Martinus Bernardus Vermeulen, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1214 days.

(21) Appl. No.: 12/627,094

(22) Filed: Nov. 30, 2009

(65) Prior Publication Data
US 2010/0157263 A1 Jun. 24, 2010

Related U.S. Application Data (60) Provisional application No. 61/139,487, filed on Dec. 19, 2008.

(51) Int. Cl.
*G03B 27/42* (2006.01)
*G03F 7/20* (2006.01)

(52) U.S. Cl.
CPC ............ *G03F 7/704* (2013.01); *G03B 27/42* (2013.01); *G03F 7/70516* (2013.01); *G03F 7/70775* (2013.01); *G03F 7/7085* (2013.01)

(58) Field of Classification Search
USPC .......................................... 355/53, 72, 74, 75
See application file for complete search history.

(56) References Cited

U.S. PATENT DOCUMENTS

| | | | | |
|---|---|---|---|---|
| 5,506,684 A | * | 4/1996 | Ota et al. | 355/53 |
| 6,020,964 A | * | 2/2000 | Loopstra et al. | 356/401 |
| 6,094,255 A | * | 7/2000 | Ota | 355/75 |
| 6,819,425 B2 | | 11/2004 | Kwan | |
| 7,019,842 B2 | | 3/2006 | Holzapfel et al. | |
| 7,839,485 B2 | | 11/2010 | Shibazaki | |
| 2001/0033369 A1 | * | 10/2001 | Matsui | 355/53 |
| 2006/0267231 A1 | * | 11/2006 | Van Santen et al. | 264/40.1 |

(Continued)

FOREIGN PATENT DOCUMENTS

| | | |
|---|---|---|
| EP | 1918777 | 7/2008 |
| JP | 07-074079 | 3/1995 |

(Continued)

OTHER PUBLICATIONS

Japanese Office Action dated Dec. 26, 2011 in corresponding Japanese Patent Application No. 2009-281089.

*Primary Examiner* — Glen Kao
(74) *Attorney, Agent, or Firm* — Pillsbury Winthrop Shaw Pittman LLP (57) ABSTRACT

The invention relates to a lithographic apparatus including an illumination system configured to condition a radiation beam, a patterning device support constructed to support a patterning device, the patterning device being capable of imparting the radiation beam with a pattern in its cross-section to form a patterned radiation beam, a substrate support constructed to hold a substrate; a projection system configured to project the patterned radiation beam onto a target portion of the substrate, and an encoder-type measurement system configured to at least during projection of the patterned radiation beam onto a target portion of the substrate continuously determine a position quantity of a patterning device supported on the patterning device support using a grid or grating provided on the patterning device.

17 Claims, 5 Drawing Sheets

(56) References Cited

U.S. PATENT DOCUMENTS

| | | |
|---|---|---|
| 2008/0100818 A1 * | 5/2008 | Onvlee et al. .................. 355/72 |
| 2009/0004580 A1 | 1/2009 | Kanaya |

FOREIGN PATENT DOCUMENTS

| | | |
|---|---|---|
| JP | 07-183214 | 7/1995 |
| JP | 07-335529 | 12/1995 |
| JP | 10-064811 | 3/1998 |
| JP | 10-223519 | 8/1998 |
| JP | 2004-509329 | 3/2004 |
| JP | 2007-093546 | 4/2007 |
| JP | 2007-180553 | 7/2007 |
| JP | 2008-076650 | 4/2008 |
| JP | 2008-112997 | 5/2008 |
| JP | 2008-300839 | 12/2008 |
| WO | 2007/083758 | 7/2007 |
| WO | WO 2007138834 A1 * | 12/2007 |

* cited by examiner

LITHOGRAPHIC APPARATUS, AND PATTERNING DEVICE FOR USE IN A LITHOGRAPHIC PROCESS

CROSS REFERENCE TO RELATED APPLICATIONS

This application claims priority and benefit under 35 U.S.C. §119(e) to U.S. Provisional Patent Application No. 61/139,487, entitled "Lithographic Apparatus, And Patterning Device For Use In A Lithographic Process", filed on Dec. 19, 2008. The content of that application is incorporated herein in its entirety by reference.

FIELD

The present invention relates to a lithographic apparatus and a patterning device for use in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a scanning type lithographic apparatus, a patterning device (e.g. a mask) is carried by a patterning device support, also referred to as mask table or patterning device table. While generating a pattern on a target portion of a substrate, the patterning device support performs scanning movements along a line of movement, in a single scan direction or scanning in both (i.e. opposite) directions along the line of movement. When a reversal of direction takes place, the patterning device support is decelerated and accelerated between the successive scanning movements. Also, the patterning device support is accelerated and decelerated before and after each scanning movement in a specific direction. Conventionally, the scanning movements are made with constant velocity. However, the scanning movements may also at least partly be made with varying velocity, e.g. the movements including at least part of the deceleration and/or acceleration phases.

The patterning device support holds the patterning device in a manner that depends on the orientation of the patterning device, the design of the lithographic apparatus, and other conditions, such as for example whether or not the patterning device is held in a vacuum environment. The patterning device support may include a frame or a table, for example, which may be fixed or movable as required. The patterning device support (and its control system) may ensure that the patterning device is at a desired position, for example with respect to the projection system.

The patterning device is coupled to the patterning device support through a clamp. Conventionally, the patterning device is coupled to the patterning device support through a vacuum clamp which may be implemented as one or more vacuum pads provided on the patterning device support, where at least a part of a circumferential area of the patterning device is held onto the vacuum pads. By the clamp, a normal force between adjacent surfaces of the patterning device and the patterning device support is generated, resulting in a friction between contacting surfaces of the patterning device and the patterning device support. The vacuum pads may include one or more openings coupled to a gas discharge and supply system. Instead of a vacuum coupling between the patterning device and the patterning device support, other forms of couplings based on friction between the patterning device and the patterning device support are conceivable, such as electrostatic or mechanical clamping techniques to hold the patterning device against the patterning device support.

In an ongoing development, increasing throughput requirements placed on lithographic apparatus lead to increasing scanning velocities. Consequently, deceleration and acceleration of the patterning device support increase. In the deceleration and acceleration phases, increased inertia forces act on the patterning device support and on the patterning device.

It is known that inertia forces acting on the patterning device support and the patterning device may lead to slip of patterning device and patterning device support relative to each other. The slip usually is in the order of nanometers. For relatively low decelerations and accelerations, the slip has appeared to be low and approximately constant over time, changing its direction with each deceleration/acceleration phase. In such circumstances, the slip may be ignored if it is sufficiently low, or the slip may be compensated by suitably calibrating a positioning device controlling the position (and hence, the movement) of the patterning device support and/or the substrate stage.

However, with increasing decelerations and accelerations, the slip occurring between the patterning device and the patterning device support increases, and becomes variable and unpredictable. Factors influencing the amount of slip may include, but may not be limited to, a flatness and roughness of the surfaces of the patterning device and the patterning device support engaging each other, a humidity of the atmosphere(s) in which the patterning device and the patterning device support are handled, a contamination of the patterning device or the patterning device support, and a degree of vacuum when the patterning device is held on the patterning device support by vacuum pads. Thus, a calibration of the positioning device will not lead to a correct positioning of the patterning device support and/or the substrate stage under the circumstances of high inertia forces.

Not only the speed of movement and acceleration of the patterning device support may tend to increase, also, accuracy requirements on the lithographic apparatus may become more stringent. Therefore, slip of the patterning device becomes less tolerable, as slip of the patterning device may result in a position error of the pattern projected onto the substrate.

It has been proposed to provide mechanical solutions to avoid slip between the patterning device support and the patterning device, such as enhanced clamping force between the patterning device support and the patterning device and/or an optimized clamp design. Also it has been proposed to provide a patterning device pushing device which exerts a compensation force on a side of the patterning device to avoid slip between the patterning device and the patterning device. However, none of these solutions is capable of sufficiently avoiding the imaging errors, in particular overlay errors at higher acceleration levels of the patterning device support.

In another solution a feed-forward compensation controller was provided in which slip between patterning device and patterning device support was taken into account. However, the variation in the amount of slip at a certain acceleration level is unpredictable. As a result, feed-forward compensation may not provide a reliable compensation for the slip between patterning device and patterning device support.

In US2008/0100818, which is CIP application of US2008/0100819, the contents of which are herein incorporated by reference, it is proposed to provide a support position sensor to measure a position of the support relative to a first structure of the lithographic apparatus, and a patterning device position sensor to measure a position of the patterning device relative to a second structure of the lithographic apparatus. A control device is provided to determine a correlation between the position of the patterning device and the position of the support from the position measured by the support position sensor, the position measured by the patterning device position sensor, and mutual positions of the first and second structures. On the basis of this correlation, the amount of slip between the patterning device and the patterning device support is determined and compensated in the position control of the patterning device support.

SUMMARY

It is desirable to provide a position measurement system for a patterning device in a lithographic apparatus in which slip between the patterning device and the patterning device support is taken into account.

According to an embodiment of the invention, there is provided a lithographic apparatus including an illumination system configured to condition a radiation beam; a patterning device support constructed to support a patterning device, the patterning device being capable of imparting the radiation beam with a pattern in its cross-section to form a patterned radiation beam; a substrate support constructed to support a substrate; a projection system configured to project the patterned radiation beam onto a target portion of the substrate, and an encoder-type measurement system configured to determine a position quantity of a patterning device supported on the patterning device support using a grid or grating provided on the patterning device, wherein the measurement system is configured to at least during projection of the patterned radiation beam onto a target portion of the substrate continuously determine the position quantity of the patterning device.

According to an embodiment of the invention, there is provided a patterning device including a pattern to form in a scanning-type lithographic apparatus a patterned radiation beam; and a grid or grating to cooperate with an encoder-type measurement system of the lithographic apparatus, the grid or grating extending in a scanning direction over a complete length of at least the pattern.

According to an embodiment of the invention, there is provided a patterning device including a pattern to form in a scanning-type lithographic apparatus a patterned radiation beam; and a grid or grating to cooperate with an encoder-type measurement system of the lithographic apparatus, the grid or grating having the function of reference grid or grating of the measurement system.

According to an embodiment of the invention, there is provided a lithographic apparatus including: an illumination system configured to condition a radiation beam; a patterning device support constructed to support a patterning device, the patterning device being capable of imparting the radiation beam with a pattern in its cross-section to form a patterned radiation beam; a substrate support constructed to support a substrate; a projection system configured to project the patterned radiation beam onto a target portion of the substrate, and an encoder-type measurement system configured to determine a position quantity of a substrate supported on the substrate support using a grid or grating provided on the substrate, wherein the measurement system is configured to at least during projection of the patterned radiation beam onto a target portion of the substrate continuously determine the position quantity of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
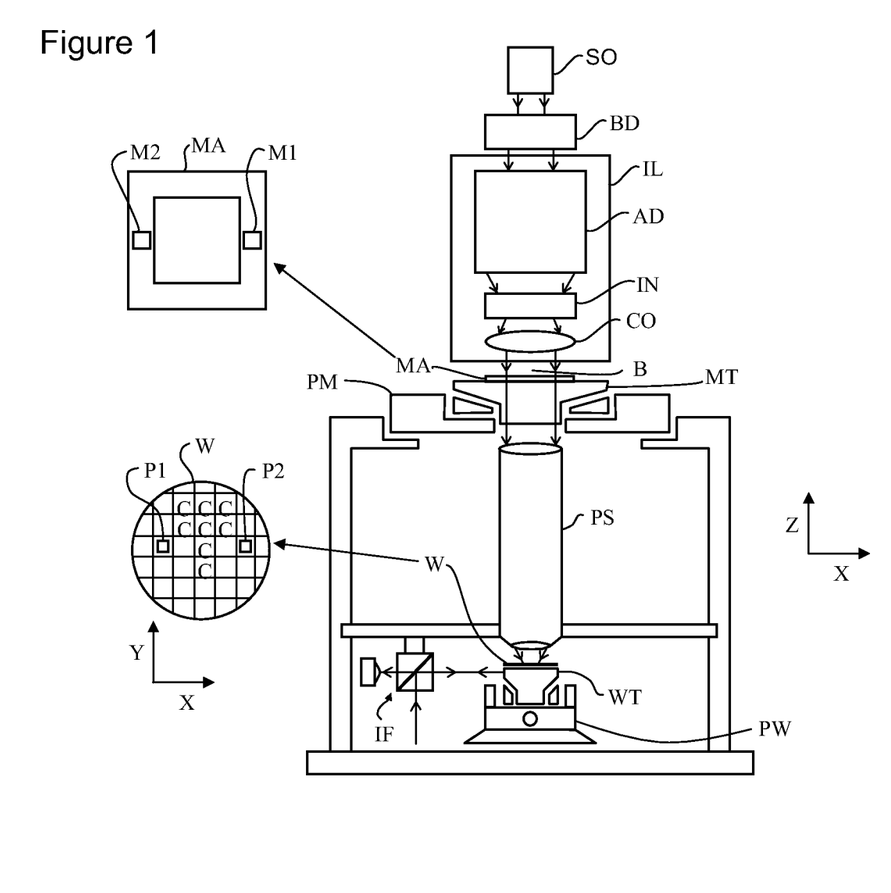
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
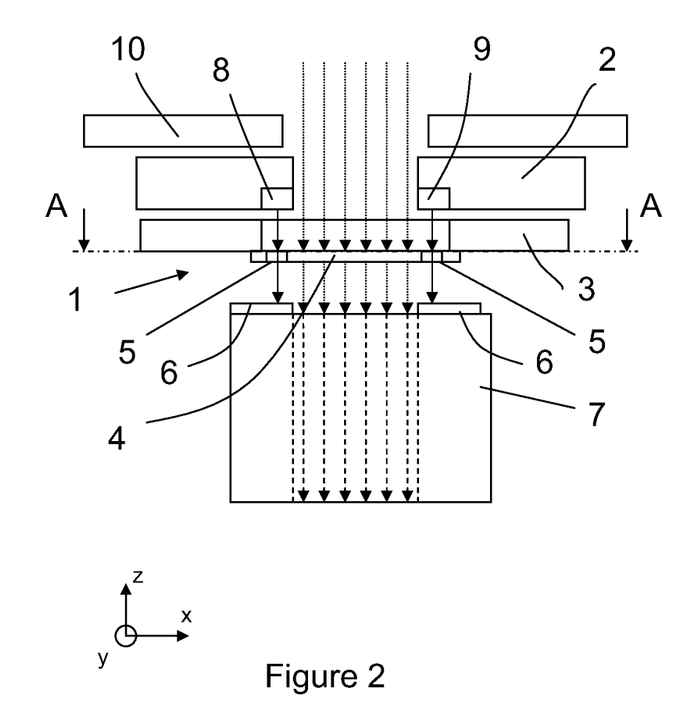
FIG. 2 depicts a side view of a patterning device support and a projection system of a lithographic apparatus according to an embodiment of the invention.
Figure 3:
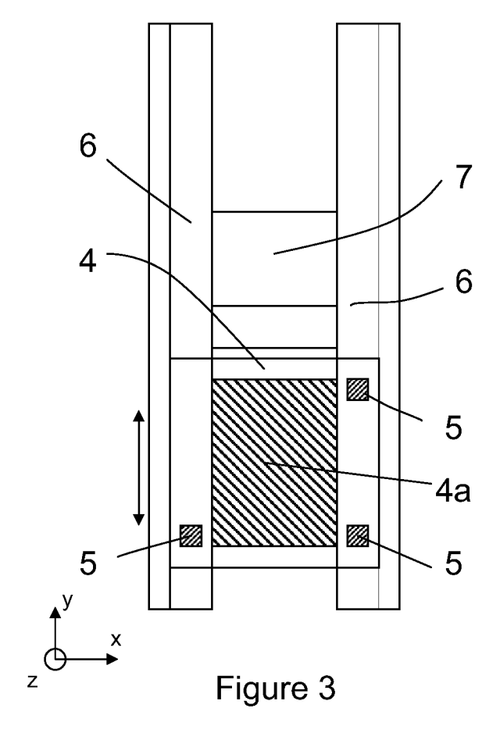
FIG. 3 depicts a top view from the line A-A of the embodiment of FIG. 2.

FIGS. 2 and 3 show partially a lithographic apparatus including a patterning device support 1 having a long-stroke part 2 and a short-stroke part 3. The long-stroke part 2 is provided to make displacements over substantially the whole working range of the lithographic apparatus. For this reason a long-stroke actuator is provided between a frame 10, for instance a base frame of the lithographic apparatus, and the long-stroke part 2. However, the positioning accuracy of the long stroke part 2 is relative low.

To increase the positioning accuracy of the patterning device, the short-stroke part 3 is provided. The short stroke part 3 is configured to support a patterning device 4 having a pattern 4a. A short-stroke actuator is provided between the long-stroke part 2 and the short-stroke part 3. This short-stroke actuator can only move the short-stroke part 3 over a small range with respect to the long-stroke part 2, but the movements can be performed with high accuracy.

The patterning device support 1 is configured to perform up and down scanning movements in the scanning direction y. In the x and Rz directions only small movements will be required.

In conventional lithographic apparatus, a position measurement system is provided which is configured to measure a position of the short-stroke part 3. In a position control system, the measured position is compared to a desired position of the short-stroke part 3 resulting in an error signal. The error signal is fed to a controller which provides a control signal on the basis of the error signal. The control signal is fed to the long-stroke and/or short-stroke actuator to move the short-stroke part to the desired position.

However, when slip occurs between the short-stroke part 3 and the patterning device 4, the patterning device 4 may not be positioned in the correct position even when the short-stroke part 3 is positioned in the desired position.

In the embodiment of FIGS. 2 and 3, the encoder-type measurement system is provided to directly measure the position of the patterning device 4 using a grid or grating 5 which is provided on the patterning device 4. The patterning device 4 includes three grids or gratings 5 which are provided in corner areas of the patterning device 4. Preferably, each grid or grating 5 is provided at the patterned side of the patterning device 4. The term "grating" as used herein is encompassed to cover any structure including a repetitive pattern and which is configured to cooperate with an encoder head.

Further, the encoder measurement system is configured to at, least during actual projection of a patterned beam of radiation on a substrate, continuously measure the position of the patterning device 4, in particular as input for a control system to control a position quantity of the patterning device, such as for instance position, speed or acceleration.

In the measurement system of FIGS. 2 and 3, a second grid or grating 6 is mounted on the projection system 7 at opposite sides of the projection beam. This second grid or grating 6 extends over the complete working range of the patterning device support 1, and has, in this embodiment in the scanning direction y larger dimensions than the projection system 7 itself. As an alternative embodiment, the second grid or grating may be mounted on any other substantially stationary object, for instance a metrology frame supporting the projection system 7.

The position measurement system includes two encoder heads 8 (only one shown) configured to determine a position of the patterning device 4 in a scanning direction y of the lithographic apparatus, and one encoder head 9 configured to determine a position of the patterning device 4 in a direction x perpendicular to the scanning direction of the lithographic apparatus. The encoder heads 8, 9 are each aligned with a grid or grating 5 on the patterning device 4. With these encoder heads 8, 9, the position of the patterning device 4 in three degrees of freedom (x, y, Rz) can be measured directly. The encoder heads 8, 9 are mounted on the long-stroke part 2 of the patterning device support 1. As an alternative the encoder heads 8, 9 may be mounted on the short stroke part 2.

Each encoder head 8, 9 is configured to determine a position quantity with respect to the second grid or grating 6 of the projection system 7, whereby the grid or grating 5 of the patterning device 4 is used as a reference grid or grating. US 2004/051881 A1, the contents of which are herein incorporated by reference in its entirety, discloses an encoder head which could be applied in the embodiment of FIGS. 2 and 3 with the exception that the reference grid, or scanning grid, of the encoder measurement system is not mounted in the encoder head itself, but on the patterning device 4.

Figure 4:
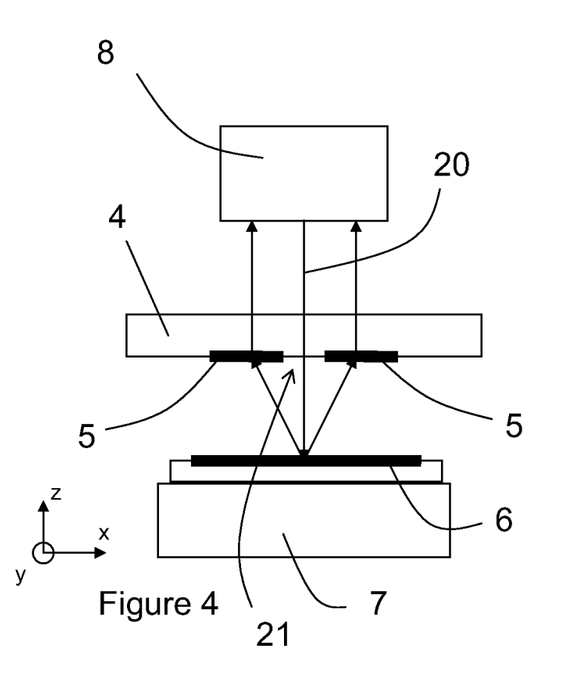
FIG. 4 depicts schematically an embodiment of an encoder-type measurement system to measure a position of the patterning device with respect to the projections system.
Figure 5:
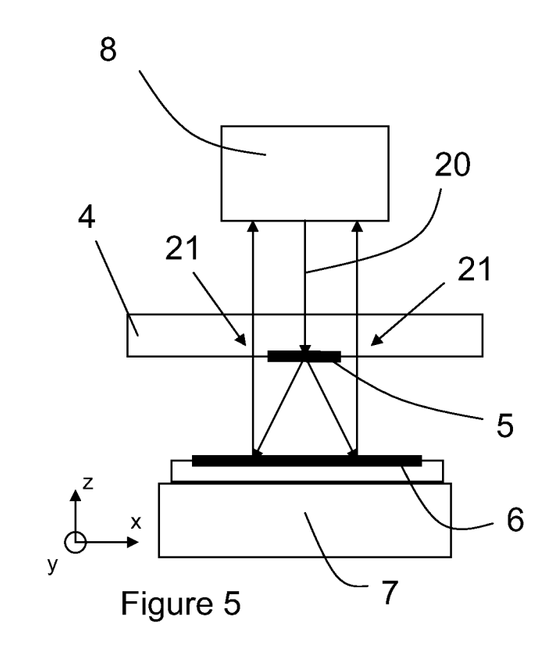
FIG. 5 depicts schematically another embodiment of an encoder-type measurement system to measure a position of the patterning device with respect to the projections system.

FIGS. 4 and 5 disclose two applications in which the grid or grating on the patterning device 4 is used as a reference grid for the encoder measurement system 1.

In FIG. 4, an encoder head 8 is shown which is mounted on the patterning device support 1, for instance the long-stroke part 2. The encoder head 8 includes a illumination source, and a sensing device. The illumination source emits a measurement beam 20 towards the second grid or grating 6 on the projection system 7. The measurement beam 20 passes the patterning device 4 at a location 21, where there is not provided any grid or grating 5. Next to this location grid or gratings 5 are provided on the patterning device 4.

On the measurement grid or grating 6, the measurement beam is split in a −1 and +1 order. When this grid or grating 6 for instance moves in the X direction a phase difference between −1 and +1 order is generated. The reflected −1 and +1 order beams pass the reference grid or grating 5 on the patterning device 4. On the surface of the patterning device 4, the reflected beams are bend towards the encoder head 8.

In the encoder head 8 itself, there is no reference grid or grating. As a result, the encoder head 8 can directly measure the relative displacement between the grid or grating on the patterning device 4 and the second grid or grating 6 on the projection system 7, and thus the position of the patterning device 4 with respect to the projection system 7.

The sensing device in the encoder head is provided to determine a position change between the grid or grating 5 on the patterning device 4 and the second grid or grating 6 mounted on the projection system 7.

FIG. 5 discloses an alternative embodiment of an encoder measurement including an encoder head 8 mounted on the patterning device support, for instance the long-stroke part 2. An illumination source of the encoder head emits a measurement beam 20 towards the grid or grating 5 on the patterning device 4.

On the grid or grating 5, the measurement beam is split in a −1 and +1 order. The −1 and +1 order beams are reflected on the second grid or grating 6 on the projection system towards the encoder head 8.

The reflected beams pass the patterning device 4 at locations 21, where there is not provided any grid or grating 5. In the encoder head 8 itself, there is no reference grid or grating. Corresponding to the embodiment of FIG. 4, the encoder head 8 can directly measure the relative displacement between the grid or grating on the patterning device 4 and the second grid or grating 6 on the projection system 7, and thus the position of the patterning device 4 with respect to the projection system 7.

It is noted that in the embodiments of FIGS. 4 and 5 the grid or grating 5 on the patterning device 4 has been indicated as reference grid or grating. This term has been used since the range of movement of the grid or grating 5 with respect to the encoder head 8 is substantially smaller than the range of movement of the second grid or grating 6 with respect to the encoder head 8, but should not be regarded as limiting the scope of the invention.

Now again referring to FIGS. 2 and 3; since the encoder heads 8, 9 are mounted on the long stroke part 2 of the patterning device support 1, the only possible motion range between the encoder heads 8, 9 and the patterning device 4 is the working range of the stroke short actuator and the slip between the short stroke part 3 and the patterning device 4. Since this motion range is relative small only small grid or gratings 5 have to be provided on the patterning device 5 to make continuous determination of the position quantity of the patterning device with respect to the respective encoder heads 8, 9 possible.

In an embodiment, each of the encoder heads 8, 9 may be configured to determine a distance between the grid or grating 5 on the patterning device 4 and the second grid or grating 6 on the projection system 7. On the basis of these distances, three further degrees of freedom (z, Rx, Ry) may be determined by the measurement system. The resulting measurement system can directly and continuously measure the position of a patterning device in six degrees of freedom.

It is noted that in another embodiment of the measurement system of FIGS. 2 and 3, a second encoder head 9 configured to determine a position of the patterning device 4 in a direction x perpendicular to the scanning direction of the lithographic apparatus may be provided. The second encoder head 9 may be aligned to cooperate with a grid or grating 5 provided in a corner area of the patterning device 4. The fourth encoder head 8, 9 is redundant for position measurement, but may for instance be used for calibration of the measurement system.

Also, it may be possible to use the four encoder heads 8, 9 to determine the effect of thermal influences on the patterning device 4. For instance, when the patterning device expands due to heating of the patterning device 4, the encoder heads 8, 9 can determine the influence of this heating on the size of the patterning device 4, since the grid or gratings 5 are arranged at corner locations of the patterning device 4.

The benefit of the encoder measurement system of FIGS. 2 and 3 is that the position measurement system can continuously and directly determine the position of the patterning device 4 with respect to the projection system 7. As a result, slip between the patterning device and the patterning device support 1 is no longer a problem in the position control of the patterning device 4, since the control system will position the patterning device 4 itself in the desired position, and not the patterning device support supporting the patterning device 4, as is the case in the prior art lithographic apparatus.

The measured position quantity may be used for position control of the patterning device 4. A position controller may be provided which on the basis of the difference between a desired position of the patterning device 4 and a determined actual position of the patterning device 4 provides a control signal to the actuators of the patterning device support to move the patterning device 4 to the desired position.

Another benefit is that the grid or gratings 5 on the patterning device 4 may be relative small, and may be located at any suitable location on the patterning device 4. Thus only limited space of the patterning device 4 is required for the grid or gratings 5.

As an alternative for the embodiment of FIGS. 2 and 3, it is also possible to provide encoder heads 8, 9 configured to determine a position quantity with respect to the grid or grating 5 of the patterning device 4 and with respect to the second grid or grating 6 of the projection system 7. By the combination, in particular addition, of these measured position quantities, the respective position quantity of the patterning device 4 with respect to the projection system 7 may be determined.

Figure 6:
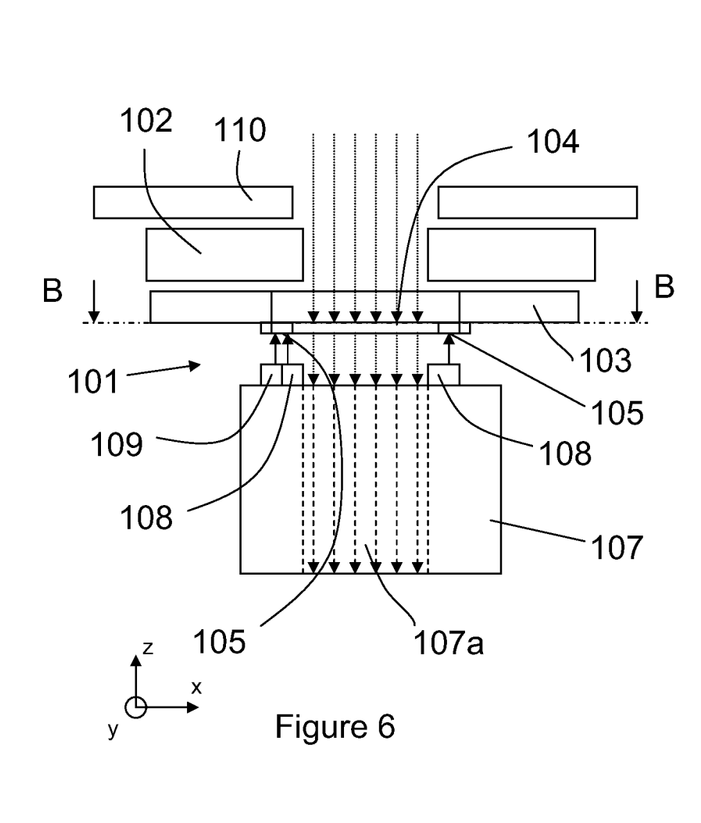
FIG. 6 depicts a side view of a patterning device support and a projection system of a lithographic apparatus according to an embodiment of the invention.
Figure 7:
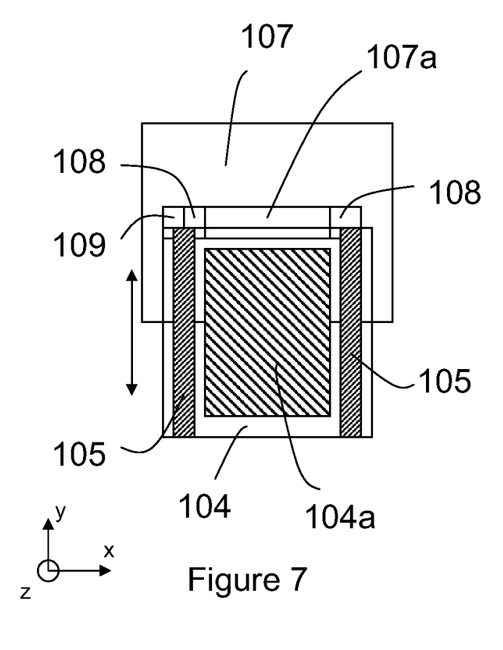
FIG. 7 depicts a top view from the line B-B of the embodiment of FIG. 4.

FIGS. 6 and 7 disclose a measurement system according to another embodiment of the invention. FIGS. 6 and 7 show, similarly to FIGS. 2 and 3, partially a lithographic apparatus including a patterning device support 101 having a long-stroke part 102 and a short-stroke part 103. A long stroke actuator is provided to move the long-stroke part 102 with respect to the base frame 110.

The short-stroke part 103 is configured to support a patterning device 104 having a pattern 104a. A short-stroke actuator is provided between the long-stroke part 102 and the short-stroke part 103. This short-stroke actuator can only move the short-stroke part 103 over a small range with respect to the long-stroke part 102, but the movements may be performed with high accuracy.

An encoder-type measurement system is provided which directly measures the position of the patterning device using a grid or grating 105 which is provided on the patterning device 104. The grid or grating 105 extends in the scanning direction (y) over the complete length of the patterning device 104.

Preferably, the grid or grating 105 is provided at the patterned side of the patterning device 104.

The position measurement system includes two encoder heads 108 configured to determine a position of the patterning device 104 in a scanning direction y of the lithographic apparatus, and one encoder head 109 configured to determine a position of the patterning device 104 in a direction x perpendicular to the scanning direction of the lithographic apparatus. The encoder heads 108, 109 are arranged on the projection system 107. The encoder heads 108, 109 may be configured as disclosed in US 2004/051881 A1, the contents of which are herein incorporated by reference in its entirety.

With these three encoder heads 108, 109, it is possible to determine the position of the patterning device 4 in three degrees of freedom (x, y, Rz), when the grid or grating 5 is aligned with the respective encoder heads 108, 109.

The encoder heads 108, 109 are arranged at opposite sides of a projection slit 107a of the projection system 107, i.e. the area through which the projection beam runs during actual projection of a pattern on a substrate. Thus, when a part of the pattern 104a is located above the projection slit 107a, the grid or grating 105 is aligned with the respective encoder heads 108, 109. As a result, the encoder measurement system is capable of, at least during actual projection of a patterned beam of radiation on a substrate, continuously measuring a position quantity of the patterning device 104.

Since the position quantities of the position of the patterning device 104 are directly measured on the patterning device 104, slip between the patterning device 104 and the patterning device support 101 is no longer a problem in the position control of the patterning device 104. The control system will position the patterning device 104 itself in the desired position, and not the patterning device support 101 supporting the patterning device 104.

However, since the encoder heads 108, 109 are arranged next to the projection slit 107a, and do not move together with the patterning device 104, as in the embodiment of FIGS. 2 and 3, the working range of the encoder measurement system is limited.

Figure 8:
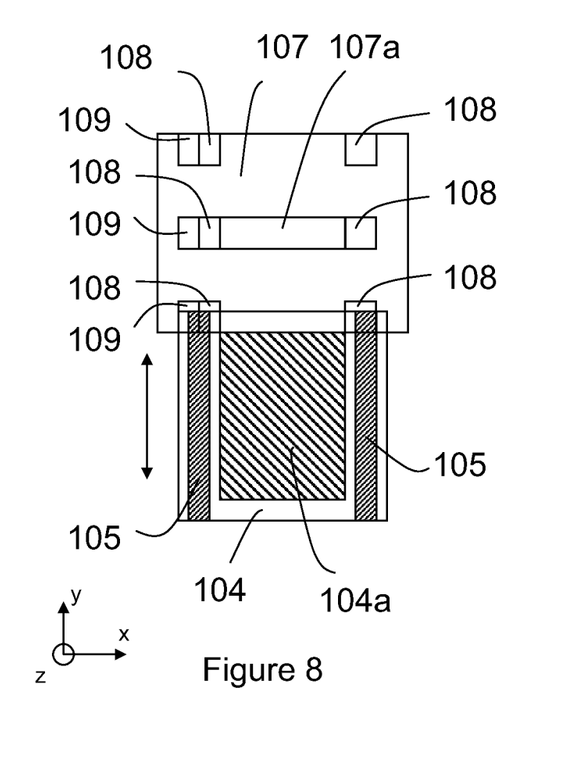
FIG. 8 depicts a top view similar to FIG. 5 with a third embodiment of the invention.

In order to have a position measurement when the grid or grating 105 is not aligned with the encoder head 108, 109 next to the projection slit 107a, it may be possible to provide a second position quantity measurement system, for instance an encoder-type or interferometer-type measurement system, which is capable of measuring a position quantity of the patterning device 104 or its support outside the working range of the encoder measurement system 108, 109, 105. As an alternative, further encoder heads 108, 109 may be provided in the main direction of movement of the patterning device support 101, i.e. the y-direction, so that the grid or grating 5 is continuously aligned with one of the sets encoder heads 108, 109. This alternative embodiment is shown in FIG. 8. In this embodiment of FIG. 6, one set of two encoder heads 108 and one encoder head 109 is always aligned with the grid or grating 105. Thus, continuous measurement of a position quantity of the patterning device 104 is possible. The different sets of encoder heads 108, 109 may also be used for calibration and/or the measurement of thermal effects on the patterning device 104.

Hereinabove, the use of one encoder head for measurement in one of the directions x,y has been described. However, it is also possible that the encoder heads are combined to measure a position quantity in both the x and y direction. Also, it may be possible that the encoder heads are capable of determining the distance between encoder heads and or the grid or grating on the patterning device 4, therewith making position measurement in six degrees of freedom possible.

Hereinabove, the term grid or grating has been used to describe repetitive encoder structures which can be read by an encoder head. Typically repetitive encoder structures are provided on the patterning device and measured based on diffraction relative to similar repetitive structures, for instance connected to the metrology frame or the projection system.

Above, embodiments of measurement systems are described which are used for directly measuring a position quantity of a patterning device supported on a patterning device support. Similar measurement systems may be used for directly measuring a position quantity of a substrate supported on a substrate table or a movable or deformable lens element of a projection system. In such case, a position quantity is measured using a grid or grating provided on the substrate or lens element.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a patterning device support constructed to support a patterning device, the patterning device being capable of imparting a radiation beam with a pattern in its cross-section to form a patterned radiation beam;
   a substrate support constructed to support a substrate;
   a projection system configured to project the patterned radiation beam onto a target portion of the substrate, and
   a measurement system configured to determine a position quantity of the patterning device relative to a stationary object using a grating provided on the patterning device and an encoder head configured to output a measurement beam, the measurement beam to interact with the grating to determine the position quantity, the patterning device supported on the patterning device support, wherein the measurement system is configured to, at least during projection of the patterned radiation beam onto the target portion of the substrate, continuously determine the position quantity of the patterning device relative to the stationary object.

2. The lithographic apparatus of claim 1, wherein the encoder head is mounted on the patterning device support and the measurement system comprises a second grating provided on the projection system or a frame supporting the projection system, and wherein the encoder head is configured to determine a position quantity of the second grating with respect to the grating of the patterning device.

3. The lithographic apparatus of claim 2, wherein the measurement system comprises a reference grid and a measurement grid, the reference grid being formed by the grating on the patterning device, and the measurement grating being formed by the second grating.

4. The lithographic apparatus of claim 2, wherein the patterning device support comprises a long-stroke part and a short-stroke part, wherein the encoder head is mounted on the long-stroke part of the patterning device support.

5. The lithographic apparatus of claim 2, wherein the encoder head is configured to transmit a first measurement beam to determine a position quantity with respect to the grating on the patterning device and a second measurement beam to determine a position quantity with respect to the second grating, a combination of these position quantities providing a position quantity of the patterning device with respect to the projection system or the frame, respectively.

6. The lithographic apparatus of claim 2, wherein the measurement system comprises three or more encoder heads mounted on the patterning device support, two encoder heads configured to measure a position quantity in a first direction, and another encoder head configured to measure a position quantity in a second direction substantially perpendicular to the first direction.

7. The lithographic apparatus of claim 6, wherein the first direction is a scanning direction and the second direction is substantially parallel to the main plane of the patterning device.

8. The lithographic apparatus of claim 6, wherein the measurement system comprises a fourth encoder head mounted on the patterning device support, the fourth encoder head configured to measure a position quantity in the second direction.

9. The lithographic apparatus of claim 1, wherein the encoder head is mounted on the projection system or a frame supporting the projection system.

10. The lithographic apparatus of claim 9, wherein the encoder head is mounted next to an area through which the patterned radiation beam is projected.

11. The lithographic apparatus of claim 9, wherein the measurement system comprises two or more encoder heads mounted on the projection system or a frame supporting the projection system, the encoder heads being arranged at opposite sides of an area through which the patterned radiation beam is projected.

12. The lithographic apparatus of claim 9, wherein the measurement system comprises three or more encoder heads mounted on the projection system or a frame supporting the projection system, two encoder heads configured to measure a position quantity in a first direction, and another encoder head configured to measure a position quantity in a second direction substantially perpendicular to the first direction.

13. The lithographic apparatus of claim 12, wherein the first direction is a scanning direction and the second direction is substantially parallel to the main plane of the patterning device.

14. The lithographic apparatus of claim 12, wherein the measurement system comprises a fourth encoder head mounted on the patterning device support, the fourth encoder head configured to measure a position quantity in the second direction.

15. The lithographic apparatus of claim 1, wherein the lithographic apparatus comprises a controller configured to control a position of the patterning device supported on the patterning device support on the basis of the position determined by the measurement system.

16. The lithographic apparatus of claim 1, wherein the stationary object is a frame of the lithographic apparatus or the projection system.

17. The lithographic apparatus of claim 1, wherein the measurement beam outputted by the encoder is in a direction substantially parallel to the patterned radiation beam.

* * * * *